United States Patent
Chen et al.

(10) Patent No.: US 9,424,177 B2
(45) Date of Patent: Aug. 23, 2016

(54) CLOCK SWITCHING METHOD, MEMORY CONTROLLER AND MEMORY STORAGE APPARATUS

(71) Applicant: PHISON ELECTRONICS CORP., Miaoli (TW)

(72) Inventors: Po-Ting Chen, Taipei (TW); Shih-Kung Lin, Hsinchu County (TW); Teng-Chun Hsu, Pingtung County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 122 days.

(21) Appl. No.: 13/802,818

(22) Filed: Mar. 14, 2013

(65) Prior Publication Data
US 2014/0215130 A1 Jul. 31, 2014

(30) Foreign Application Priority Data
Jan. 28, 2013 (TW) .................................. 102103177

(51) Int. Cl.
*G06F 1/08* (2006.01)
*G06F 12/02* (2006.01)
(Continued)

(52) U.S. Cl.
CPC ............ *G06F 12/0246* (2013.01); *G06F 1/324* (2013.01); *G06F 1/3225* (2013.01); *G06F 1/3275* (2013.01); *G06F 1/3287* (2013.01); *G11C 16/00* (2013.01); *Y02B 60/1217* (2013.01); *Y02B 60/1225* (2013.01); *Y02B 60/1228* (2013.01)

(58) Field of Classification Search
CPC .............................. G06F 1/3287; G11C 16/00
See application file for complete search history.

(56) References Cited

U.S. PATENT DOCUMENTS

| 6,393,498 B1 * | 5/2002 | Hou et al. .......................... 710/1 |
| 7,233,538 B1 * | 6/2007 | Wu ....................... G11C 11/406 365/222 |
| 2003/0063512 A1 | 4/2003 | Takahashi et al. |

(Continued)

FOREIGN PATENT DOCUMENTS

| CN | 1975634 | 6/2007 |
| CN | 101578614 | 11/2009 |
| TW | 201207621 | 2/2012 |

OTHER PUBLICATIONS

"Office Action of Taiwan Counterpart Application", issued on May 19, 2015, p. 1-p. 6, in which the listed references were cited.

(Continued)

*Primary Examiner* — Charles Rones
*Assistant Examiner* — Tian-Pong Chang
(74) *Attorney, Agent, or Firm* — Jianq Chyun IP Office

(57) ABSTRACT

A clock switching method for a memory storage apparatus is provided. The method includes: setting a value of the clock as a first operation frequency when an operation mode is switched to an initial state; determining whether a first continuous accessing time of accessing continuously a rewritable non-volatile memory module is larger than a first setting value during a period in which the operation mode is at the initial state; re-setting the value of the clock as a second operation frequency, which is smaller than the first operation frequency, to switch the operation mode to a power saving state if the first continuously access time is larger than the first setting value; and re-setting the value of the clock as the first operation frequency to switch the operation mode to a general state during a period in which the operation mode is at the power saving state.

18 Claims, 7 Drawing Sheets

(51) Int. Cl.
*G06F 1/32* (2006.01)
*G11C 16/00* (2006.01)

(56) References Cited

U.S. PATENT DOCUMENTS

| | | | | |
|---|---|---|---|---|
| 2005/0283572 | A1* | 12/2005 | Ishihara | 711/118 |
| 2006/0031692 | A1* | 2/2006 | Kato | G06F 1/3203 713/300 |
| 2006/0036884 | A1* | 2/2006 | Gammel | H03K 21/403 713/300 |
| 2006/0233036 | A1* | 10/2006 | Blodgett | G11C 7/1072 365/230.01 |
| 2007/0268777 | A1* | 11/2007 | Brox | 365/233 |
| 2008/0065786 | A1* | 3/2008 | Baska | G06F 13/1694 710/1 |
| 2009/0147393 | A1* | 6/2009 | Hakamata | 360/69 |
| 2010/0332884 | A1* | 12/2010 | Yoshida et al. | 713/324 |
| 2011/0283063 | A1* | 11/2011 | Takiyanagi | 711/114 |
| 2012/0159055 | A1 | 6/2012 | Oh | |
| 2014/0059325 | A1* | 2/2014 | Morimoto | G06F 12/0893 712/42 |

OTHER PUBLICATIONS

"Office Action of China Counterpart Application", issued on Feb. 16, 2016, p. 1-p. 16, in which the listed references were cited.

* cited by examiner

CLOCK SWITCHING METHOD, MEMORY CONTROLLER AND MEMORY STORAGE APPARATUS

CROSS-REFERENCE TO RELATED APPLICATION

This application claims the priority benefit of Taiwan application serial no. 102103177, filed on Jan. 28, 2013. The entirety of the above-mentioned patent application is hereby incorporated by reference herein and made a part of this specification.

BACKGROUND

1. Technology Field

The present invention relates to a clock switching method for a memory storage apparatus, and a memory controller and a memory storage apparatus using the clock switching method.

2. Description of Related Art

Along with the widespread of digital cameras, cell phones, and MP3 in recently years, the consumers' demand for storage media has increased drastically. Since a rewritable non-volatile memory has the characteristics of non-volatility of data, low power consumption, small volume, non-mechanical structure, and fast reading and writing speed, the rewritable non-volatile memory is the most adaptable memory to be applied in a portable electronic product, e.g., a notebook computer. A flash drive is a storage apparatus adopting flash memory as storage medium. Therefore, the flash memory industry has become a very popular part of the electronic industry in recent years.

In an operation, elements within a memory storage apparatus operate based on a clock set previously. In general, when a memory storage apparatus operates at a higher clock, the performance of the memory storage apparatus will be better but the more thermal energies are generated. In particular, the memory storage apparatus may be instable at a higher temperature. Therefore, how to adjust the clock of the memory storage apparatus to prevent the instability due to a high temperature generated by high speed accessing is one of major issues in the flash memory industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a clock switching method, a memory controller, and a memory storage apparatus capable of accessing data with a high speed while preventing an instability caused by a high temperature.

A clock switching method for a memory storage apparatus is provided, wherein the memory storage apparatus includes a memory controller and a rewritable non-volatile memory module and the memory controller and the rewritable non-volatile memory module are operated based on a clock. The clock switching methods includes: setting a value of the clock as a first operation frequency when an operation mode of the memory storage apparatus is switched to an initial state; and determining whether a first continuous accessing time of accessing continuously the rewritable non-volatile memory module is larger than a first setting value during a period in which the operation mode of the memory storage apparatus is at the initial state. The clock switching method also includes: if the first continuous accessing time of accessing continuously the rewritable non-volatile memory module is larger than the first setting value, re-setting the value of the clock as a second operation frequency to switch the operation mode of the memory storage apparatus to a power saving state. The clock switching method further includes: re-setting the value of the clock as the first operation frequency to switch the operation mode of the memory storage apparatus to a general state during a period in which the operation mode of the memory storage apparatus is at the power saving state, wherein the first operation frequency is larger than the second operation frequency.

According to an exemplary embodiment of the present invention, a memory controller disposed in a memory storage apparatus is provided. The memory controller includes a host interface, a memory interface, a power management circuit, and the memory management circuit. The host interface is configured to couple to the host system. The memory interface is coupled to the rewritable non-volatile memory module. The memory management circuit is coupled to the host interface, the memory interface and the power management circuit, and the memory management circuit is configured to instruct the power management circuit to set a value of the clock as a first operation frequency when an operation mode of the memory storage apparatus is switched to an initial state. Additionally, the memory management circuit further is configured to determine whether a first continuous accessing time of accessing continuously the rewritable non-volatile memory module is larger than a first setting value during a period in which the operation mode of the memory storage apparatus is at the initial state. If the first continuous accessing time of accessing continuously the rewritable non-volatile memory module is larger than the first setting value, the memory management circuit instructs the power management circuit to re-set the value of the clock as a second operation frequency to switch the operation mode of the memory storage apparatus to a power saving state. Furthermore, the memory management circuit instructs the power management to re-set the value of the clock as the first operation frequency to switch the operation mode of the memory storage apparatus to a general state during a period in which the operation mode of the memory storage apparatus is at the power saving state, wherein the first operation frequency is larger than the second operation frequency.

According to an exemplary embodiment of the present invention, a memory storage apparatus including a connector, a rewritable non-volatile memory module and a memory controller is provided. The connector is configured to couple to a host system, the memory controller is coupled to the connector and the rewritable non-volatile memory module, and the rewritable non-volatile memory module and the memory controller are operated based on a clock. Herein, the memory controller is configured to set a value of the clock as a first operation frequency when an operation mode is switched to an initial state. Additionally, the memory controller further is configured to determine whether a first continuous accessing time of accessing continuously the rewritable non-volatile memory module is larger than a first setting value during a period in which the operation mode is at the initial state. If the first continuous accessing time of accessing continuously the rewritable non-volatile memory module is larger than the first setting value, the memory controller re-sets the value of the clock as a second operation frequency to switch the operation mode of the memory storage apparatus to a power saving state. And, the memory controller re-sets the value of the clock as the first operation frequency to switch the operation mode of the memory storage apparatus to a general state during a period in which the operation mode is at the power saving state, wherein the first operation frequency is larger than the second operation frequency.

As described above, the clock switching method, the memory controller, and the memory storage apparatus can access data with a high speed while an instability caused by a high temperature can be prevented.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned features and advantages of the present invention more comprehensible, embodiments accompanying figures are described in detail below.

DESCRIPTION OF EMBODIMENTS

Figure 1:
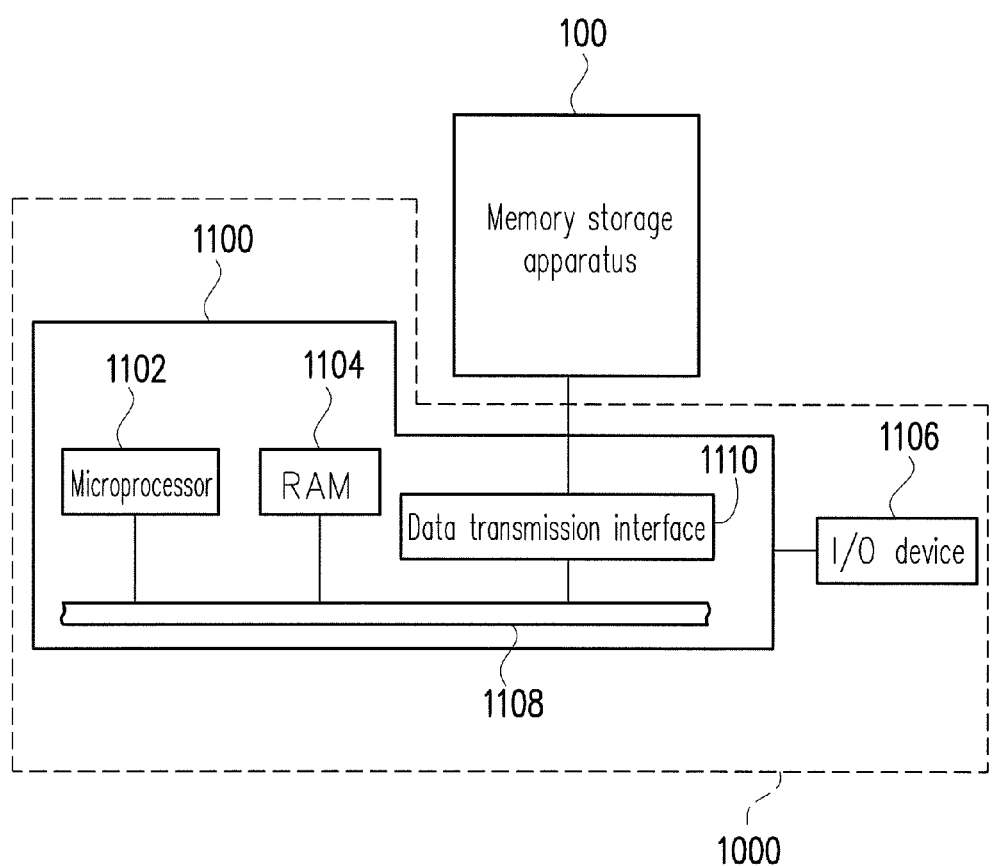
FIG. 1 illustrates a host system and a memory storage apparatus according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A memory storage apparatus (i.e., a memory storage system) typically includes a flash memory module and a controller (i.e., a control circuit). The memory storage apparatus is usually used together with a host system, such that the host system can write data into or read data from the memory storage apparatus.

FIG. 1 illustrates a host system and a memory storage apparatus according to an exemplary embodiment.

Figure 2:
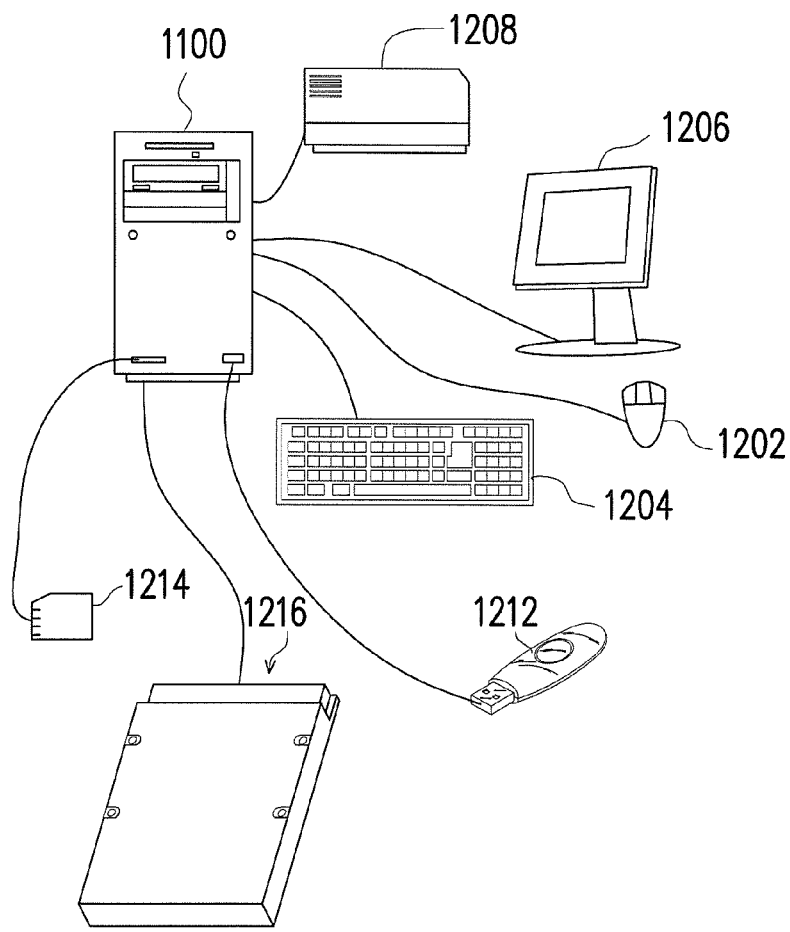
FIG. 2 schematically illustrates a computer, an input/output (I/O) device, and a memory storage apparatus according to an exemplary embodiment.
Figure 3:
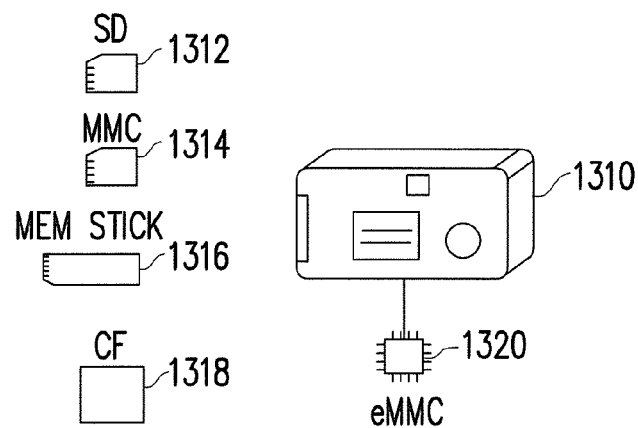
FIG. 3 illustrates a host system and a memory storage apparatus according to an exemplary embodiment.

Referring to FIG. 1, a host system 1000 usually includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 2. It should be understood that, the devices depicted in FIG. 2 should not be construed as limitations to the present disclosure, and the I/O device 1106 may include other devices as well.

In the exemplary embodiment of the present invention, the memory storage apparatus 100 is coupled to other devices of the host system 1000 through the data transmission interface 1110. By using the microprocessor 1102, the RAM 1104, and the I/O device 1106, the data can be written into or read from the memory storage apparatus 100. For instance, the memory storage apparatus 100 may be a non-volatile memory storage apparatus, such as a flash drive 1212, a memory card 1214, or a solid state drive (SSD) 1216 as shown in FIG. 2.

Generally, the host system 1000 can substantially be any system used together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so on. For instance, if the host system is a digital camera (video camera) 1310, the rewritable non-volatile memory storage apparatus is an SD card 1312, an MMC card 1314, a memory stick 1316, a CF card 1318n or an embedded storage apparatus 1320 (as shown in FIG. 1C). The embedded storage device 1320 includes an embedded MMC (eMMC). It should be noted that the eMMC is directly coupled to a substrate of the host system.

Figure 4:
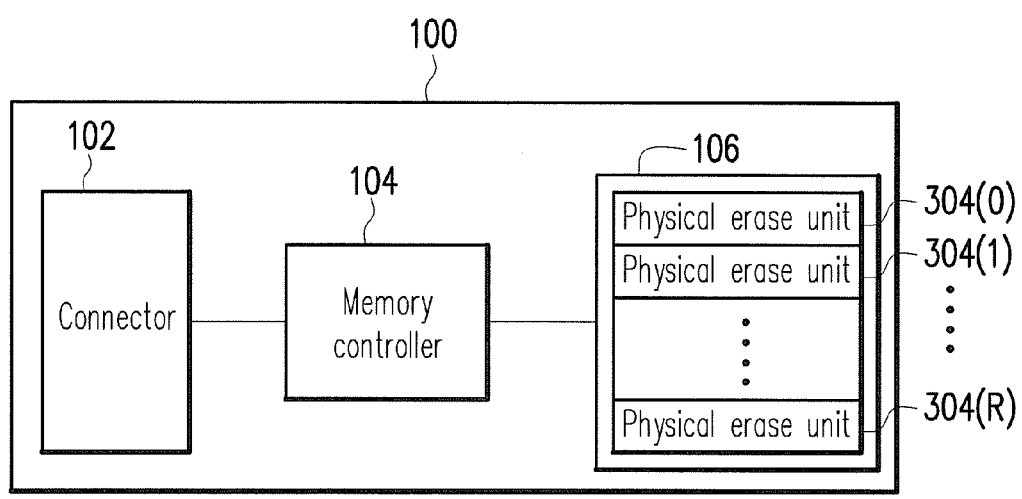
FIG. 4 is a schematic block diagram illustrating a memory storage apparatus according to an exemplary embodiment.

FIG. 4 is a schematic block diagram illustrating a memory storage apparatus according to an exemplary embodiment.

Referring to FIG. 4, the memory storage apparatus 100 includes a connector 102, a memory controller 104, and a rewritable non-volatile memory module 106.

In the present exemplary embodiment, the connector 102 is a connector complying with universal serial bus (USB). However, the present invention is not limited thereto, and the connector 102 may comply with the parallel advanced technology attachment (PATA) interface standard, the Institute of Electrical and Electronic Engineers (IEEE) 1394 interface standard, the peripheral component interconnect (PCI) express interface standard, the Serial Advanced Technology Attachment (SATA) standard, the secure digital (SD) interface standard, the Ultra High Speed-I (UHS-I) interface standard, the Ultra High Speed-II (UHS-II) interface standard, the memory stick (MS) interface standard, the multi media card (MMC) interface standard, the Embedded Multimedia Card (eMMC), the Universal Flash Storage (UFS) interface standard, the compact flash (CF) interface standard, the integrated device electronics (IDE) interface standard, or other suitable interface standards.

The memory controller 104 is configured to execute a plurality of logic gates or control commands which are implemented in a hardware form or in a firmware form and performing the operations such as data writing, reading or erasing in the rewritable non-volatile memory module 106 according to the command of the host system 1000.

The rewritable non-volatile memory module 106 is coupled to the memory controller 104 and is configured to store the data written by the host system 1000. The rewritable non-volatile memory module 106 includes a plurality of physical blocks 304(0)-410(N). For instance, the physical erase units 304(0)-304(R) can belong to the same memory die or different memory dies. Each of the physical erase units includes a plurality of physical program units and the physical program units which belong to the same physical erase unit can be written separately but erased together. For example, each physical erase unit is composed of 128 physical program units. However, the present invention is not limited thereto, and each of the physical erase units may also be comprised of 64, 256, or any other number of physical program units.

To be more specific, the physical erase unit is the smallest erasing unit. That is to say, each of the physical erase units contains the least number of memory cells that are erased together. And, one physical program unit is the smallest programming unit. In other words, each physical program unit is the smallest unit for writing the data. Each physical program unit usually includes a data bit area and a redundant bit area. The data bit area includes a plurality of physical access address for storing user data, and the redundant bit area is used for storing system data (e.g., error checking and correcting (ECC) codes). In the present exemplary embodiment, the data bit area of each physical program unit includes 4 physical access addresses and the size of one physical access address is 512 bytes. However, in another exemplary embodiment, the data bit area may include more or less physical access addresses and the present is not limited that the size and the number of the physical access addresses. For example, in an exemplary embodiment, each physical erase unit is a physical block and each physical program unit is a physical page or a physical sector. However, it should be noted that the present invention is not limited thereto.

In the present exemplary embodiment, the rewritable non-volatile memory module 106 is a multi level cell (MLC) NAND flash memory module, i.e., a memory cell can store at least 2 bits of data. However, the present invention is not limited thereto, and the rewritable non-volatile memory module 106 may also be a trinary level cell (TLC) NAND flash memory module, other flash memory module or other memory module having the same characteristic.

Figure 5:
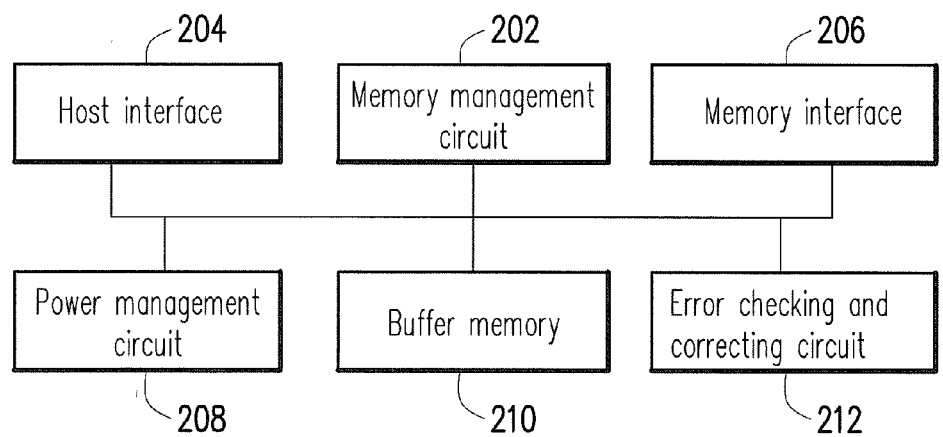
FIG. 5 is a schematic block diagram illustrating a memory controller according to an exemplary embodiment.

FIG. 5 is a schematic block diagram illustrating a memory controller according to an exemplary embodiment. It should be understood that the memory controller depicted in FIG. 5 is merely exemplary and should not be construed as a limitation to the present invention.

Referring to FIG. 5, the memory controller 104 includes a memory management circuit 202, a host interface 204, a memory interface 206, and a power management circuit 208.

The memory managing circuit 202 is configured to control the whole operation of the memory controller 104. Particularly, the memory management circuit 202 has a plurality of control instructions; when the memory storage apparatus 100 is operated, the control instructions are executed to perform a data writing operation, a data reading operation, a data erasing operation, and so on.

In the present exemplary embodiment, the control instructions of the memory managing circuit 202 are implemented in a firmware form. For example, the memory managing circuit 202 includes a microprocessor unit (not shown) and a read-only memory (ROM, not shown), wherein the control instructions are burnt in the read-only memory. When the memory storage apparatus 100 is operated, the control instructions are executed by a microprocessor unit to write, read, and erase data.

In another exemplary embodiment of the present invention, the control commands of the memory management circuit 202 may also be stored in a specific block (for example, a system block in a memory module exclusively used for storing system data) of the rewritable non-volatile memory module 106 as a programming code. Moreover, the memory management circuit 202 includes a microprocessor unit (not shown), a read-only memory (ROM, not shown) and a random access memory (not shown). In particular, the ROM has a boot code, and when the memory controller 104 is enabled, the microprocessor unit first executes the boot code to load the control instructions from the rewritable non-volatile memory module 106 into the RAM of the memory management circuit 202. The microprocessor unit then executes the control instructions to write, read, and erase data.

Furthermore, as in another exemplary embodiment, the control instructions in the memory management circuit 202 are implemented in a hardware form. For example, the memory management circuit 202 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. Wherein, the memory cell management circuit is configured to manage the physical blocks of the rewritable non-volatile memory module 106, the memory writing circuit is configured to issue the write command to the rewritable non-volatile memory module 106 in order to write the data into the rewritable non-volatile memory module 106, the memory reading circuit is configured to issue the read command to the rewritable non-volatile memory module 106 in order to read the data from the rewritable non-volatile memory module 106, the memory erasing circuit is configured to issue the erase command to the rewritable non-volatile memory module 106 in order to erase the data in the rewritable non-volatile memory module 106, and the data processing circuit is configured to process the data to be written into the rewritable non-volatile memory module 106 or the data read from the rewritable non-volatile memory module 106.

The host interface 204 is coupled to the memory management circuit 202 and configured to receive and identify the commands and the data transmitted by the host system 1000. Namely, the commands and data transmitted by the host system 1000 are passed to the memory management circuit 202 through the host interface 204. In the present exemplary embodiment, the host interface 204 complies with the USB standard. However, the present invention is not limited thereto, and the host interface 204 may also comply with the PATA standard, the IEEE 1394 standard, the PCI Express standard, the SATA standard, the SD standard, the USH-I standard, the USH-II standard, the MS standard, the MMC standard, the eMMC standard, the UFS standard, the CF standard, the IDE standard, or any other appropriate data transmission standard.

The memory interface 206 is coupled to the memory management circuit 202 for accessing the rewritable non-volatile memory module 106. In other words, the data to be written into the rewritable non-volatile memory module 106 is converted to an acceptable format for the rewritable non-volatile memory module 106 by the memory interface 206.

The power managing circuit 208 is coupled to the memory management circuit 202 and configured to control the power of the memory storage apparatus 100. For example, the power management circuit 208 includes a phase lock loop (not shown) configured to generate a clock for the memory controller 104 and the rewritable non-volatile memory storage module 106. That is, the memory controller 104 and the rewritable non-volatile memory storage module 106 operate based on the clock generated by the phase lock loop.

In an exemplary embodiment of the present invention, the memory controller 104 further includes a buffer memory 210 an error checking and correcting circuit 212.

The buffer memory 210 is coupled to the memory management circuit 202 and configured to temporarily store the data and commands from the host system 1000 or the data from the rewritable non-volatile memory module 106.

The error checking and correcting circuit 212 is coupled to the memory management circuit 202 and configured to perform an error checking and correcting procedure to assure the accuracy of data. To be more specific, when the memory management circuit 202 receives a write command from the host system 1000, the error checking and correcting circuit 212 generates an error checking and correcting code (ECC code) corresponding to the data of the write command, and the memory management circuit 202 writes the data corresponding to the write command and the corresponding ECC code into the rewritable non-volatile memory module 106. Afterwards, when the memory management circuit 202 reads the data from the rewritable non-volatile memory module 106, the corresponding error checking and correcting code is also be read, and the error checking and correcting circuit 212 executes the error checking and correcting process to the read data according to the ECC code.

In the exemplary embodiment, the memory controller 104 (or the memory management circuit 202) dynamically instructs the power management circuit 208 to adjust the clock for the operation of the memory controller 104 and the rewritable non-volatile memory module 106.

To be specific, in this exemplary embodiment, when the memory storage apparatus 100 is powered on, the memory controller 104 (or the memory management circuit 202) may set a value of the clock as a corresponding normal operation frequency (hereinafter referred as "the first operation frequency") according to the type of the rewritable non-volatile memory module 106, thereby entering an initial state. For example, the power management circuit 208 sets the value of the clock as the first operation frequency according to an instruction from the memory management circuit 202. That is, the operation mode of the data area 100 is at the initial state.

In particular, given that the operation mode of the memory storage apparatus 100 is at the initial state, the memory controller 104 (or memory management circuit 202) may monitor and determine whether the rewritable non-volatile memory module 106 is accessed (read or written) continuously. For example, in the exemplary embodiment, the memory controller 104 (or the memory management circuit 202) may determine whether read commands or write commands are received continuously from the host system 1000, and identifies that the rewritable non-volatile memory module 106 is accessed continuously to perform read commands or write commands if the read commands or the write commands are received continuously from the host system 1000.

It should be noted that identifying whether the rewritable non-volatile memory module 106 is accessed continuously based on a pattern of commands from the host system 1000 is an example and the present invention is not limited thereto. For example, in another exemplary embodiment, the memory controller 104 (or memory management circuit 202) may determine whether the rewritable non-volatile memory module 106 is accessed continuously according to an idle/busy status of the rewritable non-volatile memory module 106. For example, the memory controller 104 (or memory management circuit 202) may calculate a ratio that the rewritable non-volatile memory module 106 is at the busy state within a period of time and determine whether the ratio exceeds a default value (e.g., 90%). And, if the ratio exceeds the default value, it is identified that the rewritable non-volatile memory module 106 is accessed continuously.

When the rewritable non-volatile memory module 106 is accessed continuously, the temperature of the memory storage apparatus 100 rises fast. In particular, a higher temperature may cause an instability of the memory storage apparatus 100. In this exemplary embodiment, the memory controller 104 (or the memory management circuit 202) determines whether the time of continuously accessing the rewritable non-volatile memory module 106 (hereinafter referred as "the first continuous accessing time") is larger than a default value (hereinafter referred as "the first setting value", for example, 30 seconds). If the first continuous accessing time is larger than the first setting value, the memory controller 104 re-sets the value of the clock as a lower operation frequency (hereinafter referred as "the second operation frequency") to switch the operation mode of the memory storage apparatus to a power saving state (e.g., the power management circuit re-sets the value of the clock as the second operation frequency based an instruction from the memory management circuit 202). That is, the operation mode of the memory storage apparatus 100 is switched to a power saving state. Because the second operation frequency is smaller than the first operation frequency, when the operation mode of the memory storage apparatus 100 is at the power saving state, thermal energies generated by the operation (e.g., accessing operation) are less and therefore the temperature of the memory storage apparatus 100 will not rise anymore.

In this exemplary embodiment, given that the operation mode of the memory storage apparatus 100 is at the power saving state, the memory controller 104 (or the memory management circuit 208) may re-set the value of the clock as the first operation frequency at an appropriate time point. Therefore, memory storage apparatus 100 will not always operate with a lower performance. Herein, when the value of the clock is re-set to the first operation frequency, the operation mode of the data area 100 is switched to a general state.

To be specific, given that the operation mode of the memory storage apparatus 100 is at the power saving state, the memory controller 104 (or memory management circuit 202) may monitor and determine whether the rewritable non-volatile memory module 106 is not accessed (read or written) continuously. For example, in the exemplary embodiment, the memory controller 104 (or the memory management circuit 202) may determine whether read commands or write commands are not received from the host system 1000 for a period of time, and identifies that rewritable non-volatile memory module 106 is not accessed continuously if the read commands or the write commands are not received from the host system 1000 for the period of time.

It should be noted that identifying whether the rewritable non-volatile memory module 106 is not accessed continuously based on a pattern of commands from the host system 1000 is an example and the present invention is not limited thereto. For example, in another exemplary embodiment, the memory controller 104 (or memory management circuit 202) may determine whether the rewritable non-volatile memory module 106 is not accessed continuously according to an idle/busy status of the rewritable non-volatile memory module 106. For example, the memory controller 104 (or memory management circuit 202) may calculate a ratio that the rewritable non-volatile memory module 106 is at the idle state within a period of time and determine whether the ratio exceeds a default value (e.g., 90%). And, if the ratio exceeds the default value, it is identified that the rewritable non-volatile memory module 106 is not accessed continuously.

If the rewritable non-volatile memory module 106 is not accessed continuously, the memory controller 104 (or the memory management circuit 202) determines whether the time of not continuously accessing the rewritable non-volatile memory module 106 (hereinafter referred as "the un-continuous accessing time") is larger than a default value (hereinafter referred as "the second setting value", for example, 20 minutes). If the un-continuous accessing time is larger than the second setting value, the memory controller 104 re-sets the value of the clock as the first operation frequency to switch the operation mode of the memory storage apparatus 100 to the general state (e.g., the power management circuit 208 re-sets the value of the clock as the first operation frequency based an instruction from the memory management circuit 202). That is, the operation mode of the memory storage apparatus 100 is switched to the general state, thereby the high-speed accessing is applied. To be specific, because the operation mode of the memory storage apparatus 100 is at the power saving state and the rewritable non-volatile memory module is not accessed for a period of time, the temperature of the memory storage apparatus 100 has dropped. Thus, the value of the clock may be to re-set as the first operation frequency such that the high-speed accessing can be applied.

It should be noted that re-setting the value of the clock as the first operation frequency according to the un-continuous accessing time is an example, and the present invention is not limited thereto. For example, in another exemplary embodiment, the memory controller 104 (or the memory management circuit 202) may count a time (hereinafter referred to as "the operation time") once the operation mode is switched to the power saving state, and when the operation time reaches a predetermined time, the memory controller 104 (or the memory management circuit 202) may re-set the value of the clock as the first operation frequency such that the operation mode is switched to the general state. That is, the value of the clock is re-set as the first operation frequency after being set as the second operation frequency for a period of time.

Given that the operation mode of the memory storage apparatus 100 is at the general state, the memory controller 104 (or the memory management circuit 202) monitors and determines whether the rewritable non-volatile memory module 106 is accessed continuously, and determines whether the time of continuously accessing the rewritable non-volatile memory module 106 (hereinafter referred as "the second continuous accessing time") is larger than a default value (hereinafter referred as "the third setting value", for example, 30 seconds). If the second continuous accessing time is larger than the third setting value, the memory controller 104 re-sets the value of the clock as the second operation frequency to switch the operation mode of the memory storage apparatus 100 to the power saving state (e.g., the power management circuit 208 re-sets the value of the clock as the second operation frequency based an instruction from the memory management circuit 202).

In order to identify the operation mode of the memory storage apparatus, in the exemplary embodiment, the memory controller 104 (or the memory management circuit 202) is equipped with a state machine and the state of the state machine is updated according to the clock.

Figure 6:
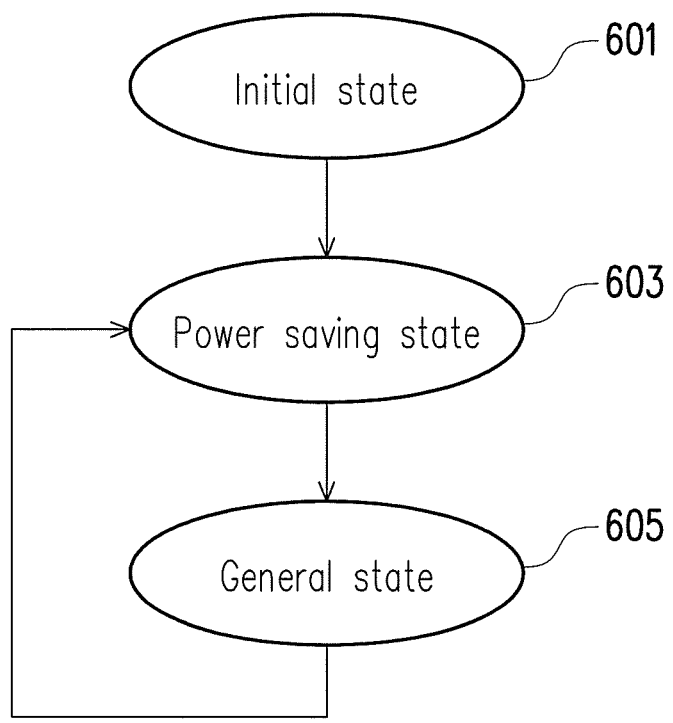
FIG. 6 is a diagram illustrating a state machine according to an exemplary embodiment.

FIG. 6 is a diagram illustrating a state machine according to an exemplary embodiment.

Referring to FIG. 6, when the memory storage apparatus 100 is powered on, the memory controller 104 operate based on the first operation frequency and the state machine is at the initial state 601. Then, if the time of accessing continuously the rewritable non-volatile memory module 106 during the initial state is larger than the first setting value, the memory controller sets the value of the clock as the second operation frequency and the state machine will be at the power saving state 603. Then, if the time of not continuously accessing the rewritable non-volatile memory module 106 during the power saving state is larger than the second setting value, the memory controller sets the value of the clock as the first operation frequency and the state machine will be at the general state 605. Furthermore, if the time of accessing continuously the rewritable non-volatile memory module 106 during the general state is larger than the third setting value, the memory controller re-sets the value of the clock as the second operation frequency and the state machine will be at the power saving state 603. Accordingly, the operation mode of the memory storage apparatus 100 will be switched between the power saving state 603 and the general state 605 according to a frequency of accessing the rewritable non-volatile memory module 106 such that the high-speed accessing can be applied and the instability due to the high temperature can be prevented. That is, the memory storage apparatus 100 of the present exemplary embodiment can prevent the instability due to the high temperature without equipping with a thermal sensor.

It should be mentioned that the first operation frequency, the second operation frequency, the first setting value, the second setting value and the third setting value are determined according to information recorded in a clock database. To be specific, the clock database is configured to store clock setting parameters corresponding to various rewritable non-volatile memory modules. For example, these clock setting parameters includes a continuously read/write time needed for rising a temperature of a rewritable non-volatile memory module to a limited temperature during the initial state, a un-continuously read/write time needed for dropping a temperature of a rewritable non-volatile memory module to a suitable temperature during the power saving state, a continuously read/write time needed for rising a temperature of a rewritable non-volatile memory module to a limited temperature during the general state, a normal operation frequency, a lower operation frequency and so on. For example, the memory controller 104 (or the memory management circuit 202) detects the type of the rewritable non-volatile memory module 106 and sets the first operation frequency, the second operation frequency, the first setting value, the second setting value and the third setting value with suitable values according to the records stored in the clock database. For example, the continuously read/write time that needed for rising the temperature of the rewritable non-volatile memory module to a limited temperature during the initial state is used to serve as the first setting value; the un-continuously read/write time needed for dropping the temperature of the rewritable non-volatile memory module to a suitable temperature during the power saving state is used to serve as the second setting value; the continuously read/write time needed for rising the temperature of the rewritable non-volatile memory module to a limited temperature during the general state is used to serve as the third setting value; the normal operation frequency is used to serve as the first operation frequency and the lower operation frequency is used to serve as the second operation frequency.

For example, the clock database is stored in a device for executing a first-time formatting procedure and when the first-time formatting procedure is performed on the memory storage apparatus 100 by the device, the memory controller 104 (or the memory management circuit 202) detects the type of the rewritable non-volatile memory module 106 and sets the first operation frequency, the second operation frequency, the first setting value, the second setting value and the third setting value by loading suitable values from the device.

Additionally, in another exemplary embodiment, the memory controller 104 (or the memory management circuit 202) may store the clock database into the rewritable non-volatile memory module 106 (e.g., the physical erase unit of the system area) and when the memory storage apparatus 100 is powered on, the memory controller 104 (or the memory management circuit 202) detects the type of the rewritable non-volatile memory module 106 and sets the first operation frequency, the second operation frequency, the first setting value, the second setting value and the third setting value by loading suitable values from the clock database. In particular, in this exemplary embodiment, because the clock database is stored into the rewritable non-volatile memory module 106, the clock setting parameters may be adjusted dynamically according to the user's demands.

Figure 7:
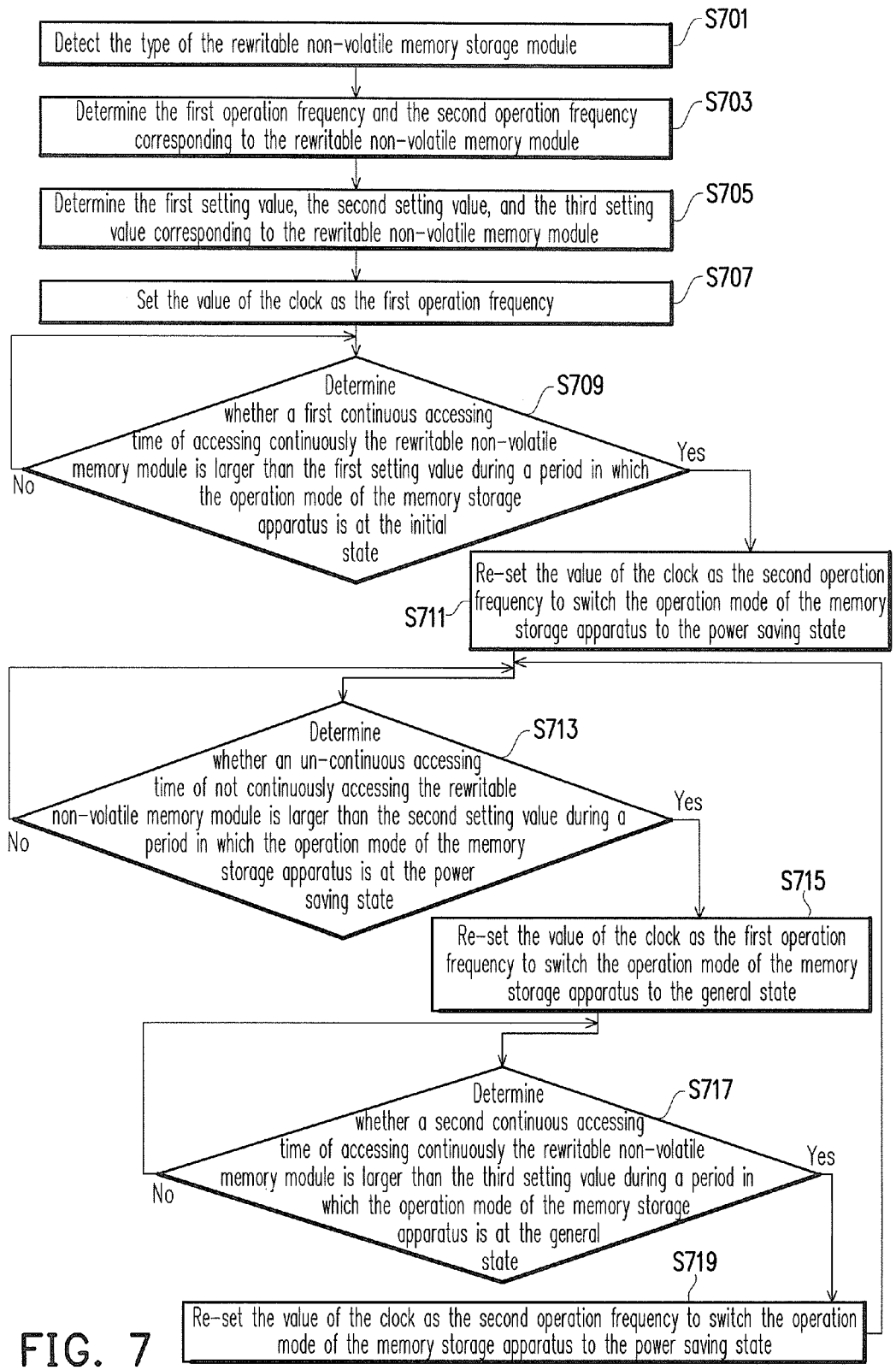
FIG. 7 is a flowchart of a clock switching method according to an exemplary embodiment of the present invention.

FIG. 7 is a flowchart of a clock switching method according to an exemplary embodiment of the present invention.

Referring to FIG. 7, in step S701, the memory controller 104 (or the memory management circuit 202) detects the type of the rewritable non-volatile memory storage module 106.

In step S703, the memory controller 104 (or the memory management circuit 202) determines the first operation frequency (e.g., a normal operation frequency) and the second operation frequency (e.g., a lower operation frequency) corresponding to the rewritable non-volatile memory module 106. And, in Step S705, the memory controller 104 (or the memory management circuit 202) determines the first setting value, the second setting value, and the third setting value corresponding to the rewritable non-volatile memory module 106. It should be noted that even though the first operation frequency and the second operation frequency are alternately used for the clock in the present embodiment, but the invention is not limited thereto. In another exemplary embodiment, more different operation frequencies may be set for various different environments. Similarly, even though the first setting value, the second setting value and the third setting value are served as thresholds for switching states, but the invention is not limited thereto. In another exemplary embodiment, more different thresholds may be set for various different states.

Then, in Step S707, when the operation mode of the memory storage apparatus is switched to the initial state, the memory controller 104 (or the memory management circuit 202) set the value of the clock as the first operation frequency. And, in Step S709, the memory controller 104 (or the memory management circuit 202) determines whether a first continuous accessing time of accessing continuously the rewritable non-volatile memory module 106 is larger than the first setting value during a period in which the operation mode of the memory storage apparatus 100 is at the initial state. If the first continuous accessing time is not larger than the first setting value, Step S709 is performed again.

If the first continuous accessing time is larger than the first setting value, in Step S711, the memory controller 104 (or the memory management circuit 202) re-sets the value of the clock as the second operation frequency to switch the operation mode of the memory storage apparatus 100 to the power saving state.

Then, in Step S713, the memory controller 104 (or the memory management circuit 202) determines whether an un-continuous accessing time of not continuously accessing the rewritable non-volatile memory module 106 is larger than the second setting value during a period in which the operation mode of the memory storage apparatus 100 is at the power saving state. If the un-continuous accessing time is not larger than the second setting value, Step S713 is performed again.

If the un-continuous accessing time is larger than the second setting value, in Step S715, the memory controller 104 (or the memory management circuit 202) re-sets the value of the clock as the first operation frequency to switch the operation mode of the memory storage apparatus 100 to the general state.

Then, in Step S717, the memory controller 104 (or the memory management circuit 202) determines whether a second continuous accessing time of accessing continuously the rewritable non-volatile memory module 106 is larger than the third setting value during a period in which the operation mode of the memory storage apparatus 100 is at the general state. If the second continuous accessing time is not larger than the third setting value, Step S717 is performed again.

If the second continuous accessing time is larger than the third setting value, in Step S719, the memory controller 104 (or the memory management circuit 202) re-sets the value of the clock as the second operation frequency to switch the operation mode of the memory storage apparatus 100 to the power saving state.

Accordingly, the procedure as illustrated in FIG. 7 operates between Steps S713, S715, S717, and S719 until the memory storage apparatus 100 is shut down.

Figure 8:
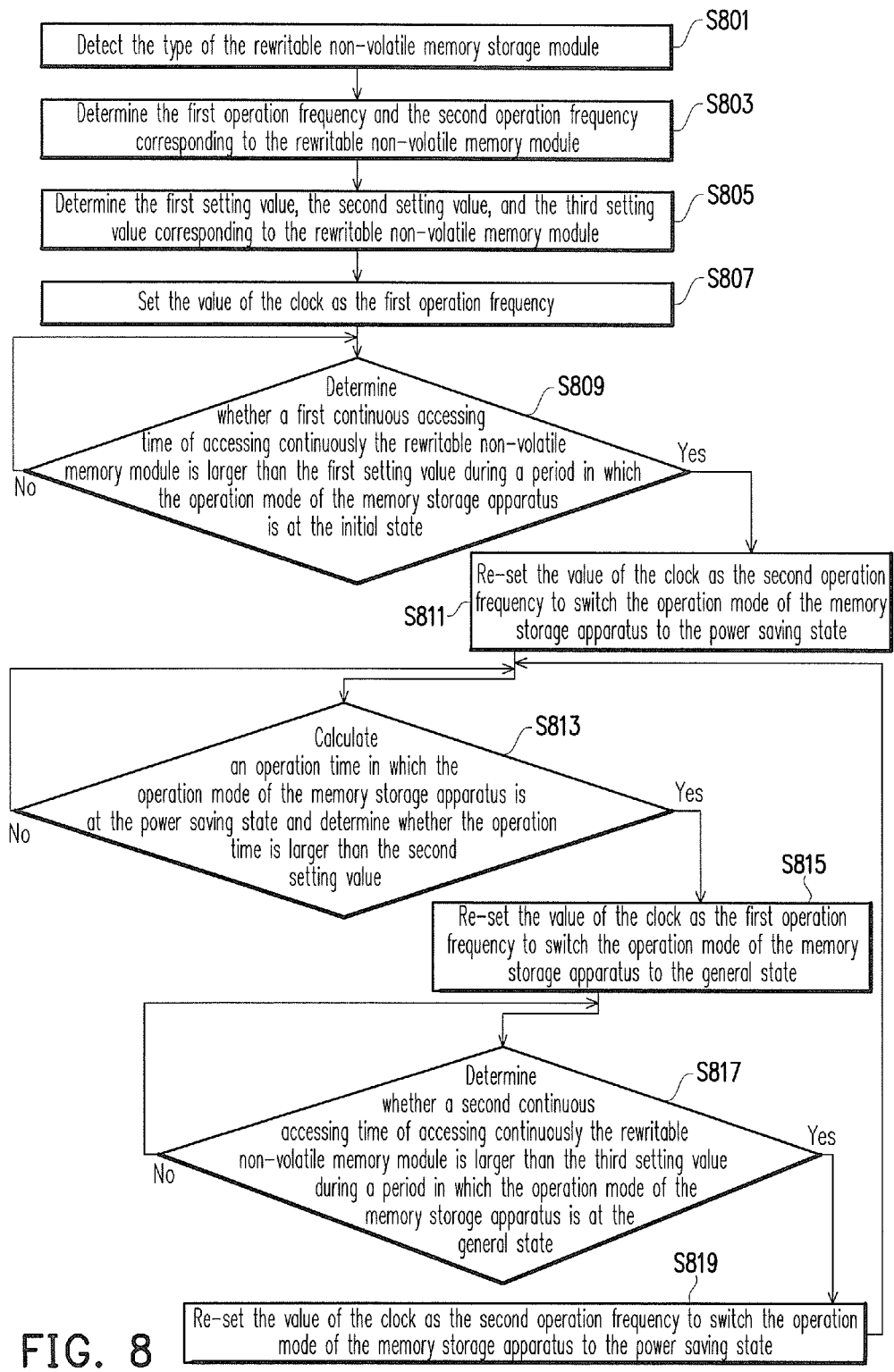
FIG. 8 is a flowchart of a clock switching method according to another exemplary embodiment of the present invention.

FIG. 8 is a flowchart of a clock switching method according to another exemplary embodiment of the present invention.

Referring to FIG. 8, in step S801, the memory controller 104 (or the memory management circuit 202) detects the type of the rewritable non-volatile memory storage module 106.

In step S803, the memory controller 104 (or the memory management circuit 202) determines the first operation frequency (e.g., a normal operation frequency) and the second operation frequency (e.g., a lower operation frequency) corresponding to the rewritable non-volatile memory module 106. And, in Step S805, the memory controller 104 (or the memory management circuit 202) determines the first setting value, the second setting value, and the third setting value corresponding to the rewritable non-volatile memory module 106.

Then, in Step S807, when the operation mode of the memory storage apparatus is switched to the initial state, the memory controller 104 (or the memory management circuit 202) set the value of the clock as the first operation frequency. And, in Step S809, the memory controller 104 (or the memory management circuit 202) determines whether a first continuous accessing time of accessing continuously the rewritable non-volatile memory module is larger than the first setting value during a period in which the operation mode of the memory storage apparatus 100 is at the initial state. If the first continuous accessing time is not larger than the first setting value, Step S809 is performed again.

If the first continuous accessing time is larger than the first setting value, in Step S811, the memory controller 104 (or the memory management circuit 202) re-sets the value of the clock as the second operation frequency to switch the operation mode of the memory storage apparatus 100 to the power saving state.

Then, in Step S813, the memory controller 104 (or the memory management circuit 202) calculates an operation time in which the operation mode of the memory storage apparatus 100 is at the power saving state and determines whether the operation time is larger than the second setting value. If the operation time is not larger than the second setting value, Step S813 is performed again.

If the operation time is larger than the second setting value, in Step S815, the memory controller 104 (or the memory management circuit 202) re-sets the value of the clock as the first operation frequency to switch the operation mode of the memory storage apparatus 100 to the general state.

Then, in Step S817, the memory controller 104 (or the memory management circuit 202) determines whether a second continuous accessing time of accessing continuously the rewritable non-volatile memory module 106 is larger than the third setting value during a period in which the operation mode of the memory storage apparatus 100 is at the general state. If the second continuous accessing time is not larger than the third setting value, Step S817 is performed again.

If the second continuous accessing time is larger than the third setting value, in Step S819, the memory controller 104 (or the memory management circuit 202) re-sets the value of the clock as the second operation frequency to switch the operation mode of the memory storage apparatus 100 to the power saving state.

Accordingly, the procedure as illustrated in FIG. 8 operates between Steps S813, S815, S817, and S819 until the memory storage apparatus 100 is shut down.

As described above, the clock switching method, the memory controller, and the memory storage apparatus can dynamically adjust the clock according to a pattern of accessing the rewritable non-volatile memory module, thereby accessing data with a high speed while preventing an instability caused by a high temperature of the memory storage apparatus. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A clock switching method for a memory storage apparatus, wherein the memory storage apparatus includes a memory controller and a rewritable non-volatile memory module, the memory controller and the rewritable non-volatile memory module are operated based on a clock, the clock switching method comprising:
    setting a value of the clock as a first operation frequency when an operation mode of the memory storage apparatus is switched to a first state;
    determining whether a first time of accessing continuously the rewritable non-volatile memory module is larger than a first setting value while the operation mode of the memory storage apparatus is in the first state;
    re-setting the value of the clock as a second operation frequency to switch the operation mode of the memory storage apparatus to a second state if the first time is larger than the first setting value;
    re-setting the value of the clock as the first operation frequency to switch the operation mode of the memory storage apparatus to a third state from the second state;
    determining whether a second time of accessing continuously the rewritable non-volatile memory module is larger than a third setting value while the operation mode of the memory storage apparatus is in the third state; and
    re-setting the value of the clock as the second operation frequency to switch the operation mode of the memory storage apparatus to the second state if the second continuous accessing time is larger than the third setting value,
    wherein the first operation frequency is larger than the second operation frequency.

2. The method according to claim 1, wherein the step of re-setting the value of the clock as the first operation frequency to switch the operation mode of the memory storage apparatus to the third state from the second state comprises:
    determining whether a time of not continuously accessing the rewritable non-volatile memory module is larger than a second setting value while the operation mode of the memory storage apparatus is in the second state; and
    re-setting the value of the clock as the first operation frequency to switch the operation mode of the memory storage apparatus to the third state if the time of not continuously accessing the rewritable non-volatile memory module is larger than the second setting value.

3. The method according to claim 1, wherein the step of re-setting the value of the clock as the first operation frequency to switch the operation mode of the memory storage apparatus to the third state from the second state comprises:
    calculating an operation time starting from a time of switching the operation mode of the memory storage apparatus to the second state while the operation mode of the memory storage apparatus is in the second state;
    determining whether the operation time is equal to a predetermined time; and
    re-setting the value of the clock as the first operation frequency to switch the operation mode of the memory storage apparatus to the third state if the operation time is equal to the predetermined time.

4. The method according to claim 1, further comprising:
    detecting a type of the rewritable non-volatile memory module; and
    setting the first operation frequency, the second operation frequency, the first setting value, the second setting value and the third setting value according to the type of the rewritable non-volatile memory module.

5. The method according to claim 4, further comprising:
    configuring a clock database to record the first operation frequency, the second operation frequency, the first setting value, the second setting value and the third setting value corresponding to the type of the rewritable non-volatile memory module,
    wherein the step of setting the first operation frequency, the second operation frequency, the first setting value, the second setting value and the third setting value according to the type of the rewritable non-volatile memory module comprises:
    looking up the clock database according to the type of the rewritable non-volatile memory module to set the first operation frequency, the second operation frequency, the first setting value, the second setting value and the third setting value.

6. The method according to claim 5, further comprising:
    storing the clock database into the rewritable non-volatile memory module.

7. A memory controller, disposed in a memory storage apparatus, the memory controller comprising:
    a host interface configured to couple to a host system;
    a memory interface configured to be coupled to a rewritable non-volatile memory module;
    a power management circuit; and
    a memory management circuit coupled to the host interface, the memory interface and the power management circuit, and configured to instruct the power management circuit to set a value of the clock as a first operation frequency when an operation mode of the memory storage apparatus is switched to a first state, wherein the memory management circuit is further configured to determine whether a first time of accessing continuously the rewritable non-volatile memory module is larger than a first setting value while the operation mode of the memory storage apparatus is in the first state, wherein if the first time of accessing continuously the rewritable non-volatile memory module is larger than the first setting value, the memory management circuit instructs the power management circuit to re-set the value of the clock as a second operation frequency to switch the operation mode of the memory storage apparatus to a second state, wherein the memory management circuit is further configured to instruct the power management circuit to re-set the value of the clock as the first operation frequency to switch the operation mode of the memory storage apparatus to a third state from the second state, wherein the memory management circuit is further configured to determine whether a second time of accessing continuously the rewritable non-volatile memory module is larger than a third setting value while the operation mode of the memory storage apparatus is in the third state, wherein if the second time is larger than the third setting value, the memory management circuit instructs the power management circuit to re-set the value of the clock as the second operation frequency to switch the operation mode of the memory storage apparatus to the second state, wherein the first operation frequency is larger than the second operation frequency.

8. The memory controller according to claim 7, wherein in the operation of re-setting the value of the clock as the first operation frequency to switch the operation mode of the memory storage apparatus to the third state from the second state, the memory management circuit determines whether a time of not continuously accessing the rewritable non-volatile memory module is larger than a second setting value while the operation mode of the memory storage apparatus is in the second state, wherein if the time of not continuously accessing the rewritable non-volatile memory module is larger than the second setting value, the memory management circuit instructs the power management circuit to re-set the value of the clock as the first operation frequency to switch the operation mode of the memory storage apparatus to the third state.

9. The memory controller according to claim 7, wherein in the operation of re-setting the value of the clock as the first operation frequency to switch the operation mode of the memory storage apparatus to the third state from the second state, the memory management circuit calculates an operation time starting from a time of switching the operation mode of the memory storage apparatus to the second state while the operation mode of the memory storage apparatus is in the second state and determines whether the operation time is equal to a predetermined time, wherein if the operation time is equal to the predetermined time, the memory management circuit instructs the power management circuit to re-set the value of the clock as the first operation frequency to switch the operation mode of the memory storage apparatus to the third state.

10. The memory controller according to claim 7, wherein the memory management circuit is further configured to detect a type of the rewritable non-volatile memory module and set the first operation frequency, the second operation frequency, the first setting value, the second setting value and the third setting value according to the type of the rewritable non-volatile memory module.

11. The memory controller according to claim 10, wherein the memory management circuit is further configured to look up a clock database according to the type of the rewritable non-volatile memory module to set the first operation frequency, the second operation frequency, the first setting value, the second setting value and the third setting value, wherein the clock database records the first operation frequency, the second operation frequency, the first setting value, the second setting value and the third setting value corresponding to the type of the rewritable non-volatile memory module.

12. The memory controller according to claim 11, wherein the memory management circuit is further configured to store the clock database into the rewritable non-volatile memory module.

13. A memory storage apparatus, comprising:
a connector configured to couple to a host system;
a rewritable non-volatile memory module; and
a memory controller coupled to the connector and the rewritable non-volatile memory module, wherein the rewritable non-volatile memory module and the memory controller are operated based on a clock, wherein the memory controller is configured to set a value of the clock as a first operation frequency when an operation mode is switched to a first state, wherein the memory controller is further configured to determine whether a first time of accessing continuously the rewritable non-volatile memory module is larger than a first setting value while the operation mode is in the first state, wherein if the first time is larger than the first setting value, the memory controller re-sets the value of the clock as a second operation frequency to switch the operation mode to a second state, wherein the memory controller is further configured to re-set the value of the clock as the first operation frequency to switch the operation mode to a third state from the second state, wherein the memory controller is further configured to determine whether a second time of accessing continuously the rewritable non-volatile memory module while the operation mode is in the third state is larger than a third setting value, wherein if the second time is larger than the third setting value, the memory controller re-sets the value of the clock as the second operation frequency to switch the operation mode to the second state, wherein the first operation frequency is larger than the second operation frequency.

14. The memory storage apparatus according to claim 13, wherein in the operation of re-setting the value of the clock as the first operation frequency to switch the operation mode to the third state from the second state, the memory controller determines whether a time of not continuously accessing the rewritable non-volatile memory module is larger than a second setting value while the operation mode is in the second state, wherein if the time of not continuously accessing the rewritable non-volatile memory module is larger than the second setting value, the memory controller re-sets the value of the clock as the first operation frequency to switch the operation mode to the third state.

15. The memory storage apparatus according to claim 13, wherein in the operation of re-setting the value of the clock as the first operation frequency to switch the operation mode to the third state from the second state, the memory controller calculates an operation time starting from a time of switching in which the operation mode to the second state while the operation mode of the memory storage apparatus is in the second state and determines whether the operation time is equal to a predetermined time, wherein if the operation time is equal to the predetermined time, the memory controller re-sets the value of the clock as the first operation frequency to switch the operation mode to the third state.

16. The memory storage apparatus according to claim 13, wherein the memory controller is further configured to detect a type of the rewritable non-volatile memory module and set the first operation frequency, the second operation frequency, the first setting value, the second setting value and the third setting value according to the type of the rewritable non-volatile memory module.

17. The memory storage apparatus according to claim 16, wherein the memory controller is further configured to look up a clock database according to the type of the rewritable non-volatile memory module to set the first operation frequency, the second operation frequency, the first setting value, the second setting value and the third setting value, wherein the clock database records the first operation frequency, the second operation frequency, the first setting value, the second setting value and the third setting value corresponding to the type of the rewritable non-volatile memory module.

18. The memory storage apparatus according to claim 17, wherein the memory controller is further configured to store the clock database into the rewritable non-volatile memory module.

\* \* \* \* \*